United States Patent
Lee et al.

(10) Patent No.: US 7,262,645 B2
(45) Date of Patent: Aug. 28, 2007

(54) SYSTEM AND METHOD FOR ADJUSTING THE PHASE OF A FREQUENCY-LOCKED CLOCK

(75) Inventors: Tak K. Lee, Irvine, CA (US); Jeffrey S. Putnam, Irvine, CA (US); James P. Cavallo, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 629 days.

(21) Appl. No.: 10/322,717

(22) Filed: Dec. 19, 2002

(65) Prior Publication Data

US 2004/0120443 A1   Jun. 24, 2004

(51) Int. Cl.
  *H03L 7/00* (2006.01)
  *H03L 7/06* (2006.01)
  *H03D 3/24* (2006.01)

(52) U.S. Cl. .................. 327/141; 375/376; 327/147; 327/156; 327/163

(58) Field of Classification Search ............. 375/373, 375/376; 331/47, 48; 327/39, 141, 147, 327/156, 163
See application file for complete search history.

(56) References Cited

U.S. PATENT DOCUMENTS

| | | | | |
|---|---|---|---|---|
| 4,241,308 A | * | 12/1980 | Lovelace et al. | 327/114 |
| 5,382,913 A | * | 1/1995 | Carson et al. | 327/141 |
| 2001/0004380 A1 | * | 6/2001 | Mannermaa | 375/150 |
| 2002/0122467 A1 | * | 9/2002 | Camp et al. | 375/144 |
| 2002/0154620 A1 | * | 10/2002 | Azenkot et al. | 370/347 |
| 2003/0039319 A1 | * | 2/2003 | Engelse et al. | 375/316 |
| 2003/0201840 A1 | * | 10/2003 | Schoner | 331/100 |

FOREIGN PATENT DOCUMENTS

DK   WO98/28849   *   7/1998

* cited by examiner

*Primary Examiner*—David C. Payne
*Assistant Examiner*—Aslan Ettehadieh
(74) *Attorney, Agent, or Firm*—Sterne, Kessler, Goldstein & Fox P.L.L.C.

(57) ABSTRACT

A clock signal regeneration system and method to adjust the phase of a frequency-locked clock signal is provided. The system includes a numerically controlled oscillator, a clock source, and an adder. In one embodiment, additional components are included in the system to ensure that underflow or overflow of the numerically controlled oscillator is prevented. In another embodiment, additional components are included to ensure that output pulses from the numerically controlled oscillator do not occur within a minimum time interval. The method includes deriving a phase adjustment factor, adding the phase adjustment factor to a frequency control word, providing the modified frequency control word to a numerically controlled oscillator and generating a phase shifted, frequency-locked output signal.

6 Claims, 8 Drawing Sheets

SYSTEM AND METHOD FOR ADJUSTING THE PHASE OF A FREQUENCY-LOCKED CLOCK

BACKGROUND OF THE INVENTION

1. Field of the Invention

The present invention relates to clock signal generation, and more particularly, to adjusting the phase of a frequency-locked clock.

2. Background of the Invention

The past several years have witnessed a dramatic increase in the capabilities of high-speed, high-density communications systems. Such systems may include, but are not limited to, broadband communication systems using cable modems, cellular communications systems, satellite communication systems, fiber to the home (FTTH) communications networks, and board-to-board interconnections in a myriad of electronic devices.

In many of these systems, a remote electronic device must replicate a signal provided by another electronic device. One of the more common reasons an electronic device replicates a signal provided by another device is to provide clock synchronization between two or more electronic devices. There are many reasons why remotely distributed devices may need to have their clocks synchronized. In particular, in a digital communication system the receiving device must be properly synched to a sending device to enable the efficient processing and interpretation of an incoming data stream. For example, in order for a data signal to be correctly reconstructed at the receiving end, the transmitted data must be regenerated with the fewest possible bit errors, requiring low noise and timing jitter (phase noise) at the clock generation source. In high speed data communication systems, precise clock signal generation is important to enhance efficiency and to reduce error rates that may be caused by jitter.

One type of communications system where clock signal regeneration is commonly used is a cable modem-based broadband communications system. Within a cable modem-based broadband communication system the two principle devices are cable modems and cable modem termination systems (CMTSs). In a broadband communications network that uses cable modems, typically many cable modems are connected to a CMTS. Cable modems are located at customer premises and typically connected to personal computers through an Ethernet connection. CMTSs are typically located within a service provider's network center, often known as a headend location. CMTSs exchange data with multiple cable modems at high speeds. Importantly, CMTSs transmit clock signals to cable modems for synchronization that is critical to ensuring efficient operation and high throughput.

Consumer demand for faster communication speeds and increased performance require communication system optimization. In the case of high speed cable modems, for example, the cable industry has recently released the DOCSIS 2.0 specification that introduced a new requirement that cable modem systems support synchronous code division multiple access (CDMA) communication schemes to achieve higher transmission rates. Furthermore, the DOCSIS 2.0 specification requires that ramp-down of one burst of data may completely overlap the ramp-up of the following burst of data, so that the transmitted data envelope is never zero. As a result the system timing for synchronous transmissions from various cable modems that are connected to a single CMTS must provide precise timing accuracy so that different cable modems do not appreciably interfere with each other. Synchronous transmission requires precise synchronization so that multiple cable modems can transmit simultaneously.

DOCSIS 2.0 recognizes that the timing of transmissions from a cable modem to a CMTS may need to be adjusted during operation. In particular, section 6.2.19.1 of DOCSIS 2.0 specifies that a CMTS must be able to provide a target phase offset, referred to as a ranging offset, to a cable modem. In the case of cable modems, the target phase offset is a delay correction applied by the cable modem to the CMTS upstream (from cable modem to CMTS) frame time of a clock signal derived at the cable modem. The target phase offset can represent an adjustment equal to roughly the round-trip delay of a signal between the cable modem and the CMTS, and is needed to synchronize upstream transmissions. The requirements specify that the cable modem should be able to implement the timing correction with an accuracy of plus or minus two nanoseconds to support synchronous CDMA operation.

FIG. 1 illustrates one type of clock signal regeneration system 100 that includes numerically controlled oscillator (NCO) 110 and clock source 120. Frequency control word (FCW) 130 and Clk_in signal 140 are input into NCO 110 to produce Clk_out signal 150. FCW 130 is supplied to NCO 110 to lock the frequency of Clk_out 150 to a particular external oscillation source. Typically, a timing recovery circuit provides FCW 130 based on a replicated frequency of an incoming clock signal from another device. Clock regeneration system 100 does not provide a means for dynamically adjusting the phase of the output signal.

What is needed is a cost-effective system and method for adjusting the phase of a frequency-locked clock.

SUMMARY OF THE INVENTION

The invention is directed to a clock signal regeneration system and method to adjust the phase of a frequency-locked clock signal. The system includes a NCO, a clock source and an adder. In one embodiment, additional components include, among others, a multiplexer, a register, a saturator and an adder to ensure that underflow or overflow of the NCO is prevented. In another embodiment, additional components are included to ensure that output pulses from the NCO do not occur within a minimum time interval.

The output of the NCO within the system represents a frequency-locked clock signal that is used to synchronize communications between two electronic devices. The system receives as the primary inputs, an FCW and a target phase offset. The FCW contains information that locks the frequency of the output of the NCO to a particular frequency. The target phase offset contains information instructing the system as to how much to shift the phase of the output of the NCO. In lieu of a target phase offset, a fractional target phase offset can be provided within one embodiment of the system. In this case, the fractional target phase offset represents a fraction of the period of the NCO. Other formats for specifying a phase shift can be provided and converted into a desired format.

The method includes deriving a phase adjustment factor, adding the phase adjustment factor to a frequency control word, providing the modified frequency control word to a numerically controlled oscillator and generating a phase shifted, frequency-locked output signal. In one embodiment additional steps are implemented to prevent underflow or overflow in the numerically controlled oscillator. In another embodiment, additional steps are implemented to prevent output pulses of the NCO from occurring within a minimum time interval when a phase shift is introduced.

In one embodiment of the invention, the invention can be implemented within a cable modem. In this embodiment, the invention can be used within a cable modem to respond to a ranging offset request sent by a CMTS. In this embodiment, a CMTS transmits a ranging offset request to a cable modem to adjust the phase of a frequency-locked clock signal used to synchronize the operation of the cable modem and CMTS. The cable modem will derive a target phase offset or fractional phase offset based on the ranging offset request. In other embodiments, the invention can be implemented in cellular phone handsets, in satellite receivers and in other communication devices to respond to requests to adjust the phase of timing signals transmitted from a base station or other headend systems.

Use of the invention provides three principal benefits. First, use of the invention enables electronic devices to efficiently adjust the phase of frequency-locked clock signals. Secondly, use of the invention enables precise phase adjustments to be made without impacting the frequency of a clock signal, thereby facilitating synchronous communication between devices in which guard intervals between signals can be reduced. The resultant impact is that communication speeds can be increased between devices. Finally, use of the invention within the context of cable modems will allow cable modems to achieve new requirements stipulated in DOCSIS 2.0 relating to the ability of a cable modem to provide precise timing adjustments in a clock signal.

Collectively, the benefits of the invention improve the operational efficiency and enable data throughput rates to be higher than they would be without the use of the invention.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Figure 2:
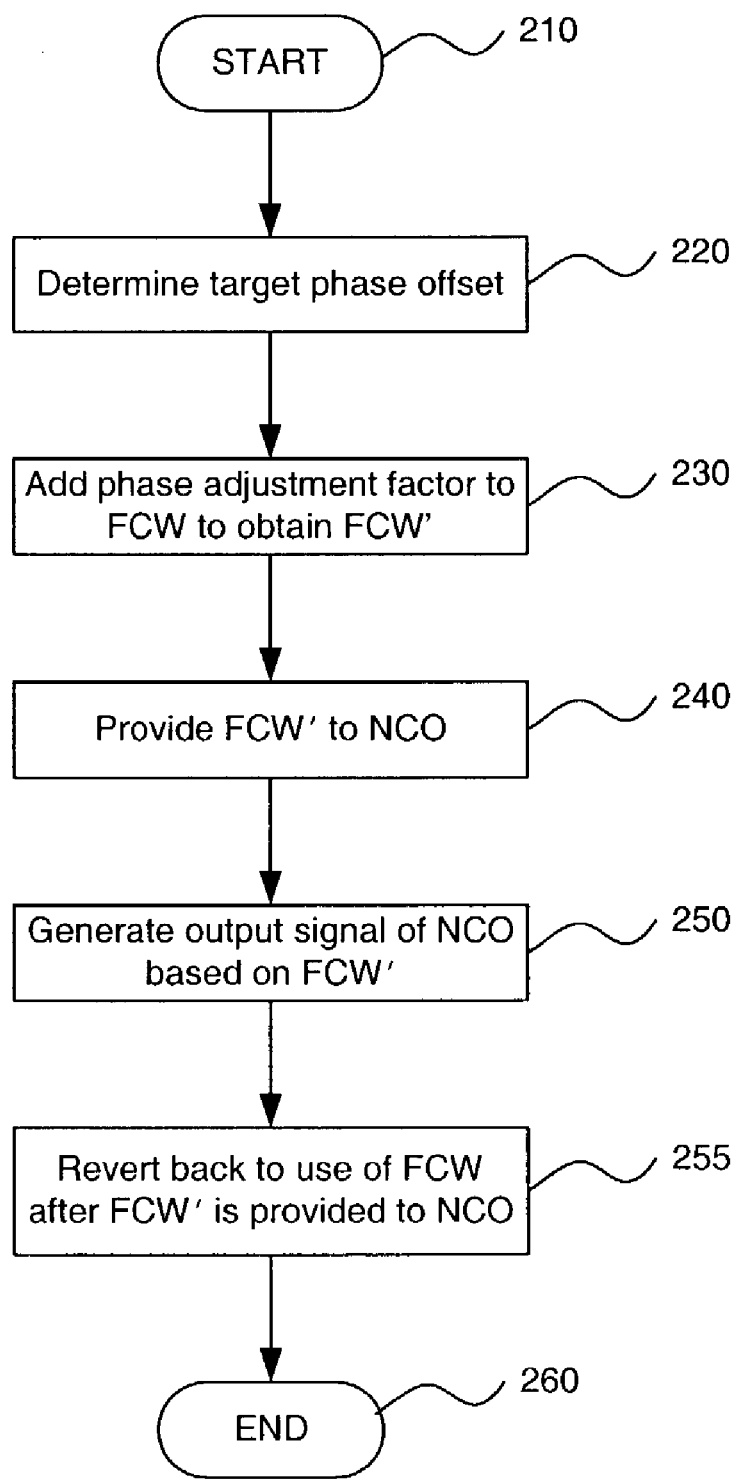
FIG. 2 is a method for adjusting the phase of a frequency locked clock, according to an embodiment of the invention.

FIG. 2 illustrates method 200 for adjusting the phase of a frequency locked clock, according to an embodiment of the invention. The method begins in step 210. In step 220, a determination is made as to what the target phase offset should be. In the case of digital communications, the target phase offset is the amount of time that the phase of a signal should be shifted. Alternatively, a target fractional phase offset can be determined. The target fractional phase offset is a fraction of the period of a signal that the phase of the signal should be shifted. For example, if Clk_out 150 had a period of one microsecond and a target phase offset of 500 nanoseconds was desired, the target fractional phase offset would be given as one-half. In one embodiment, the target phase offset or a target fractional phase offset can be derived from the ranging offset provided to a cable modem from a CMTS.

In step 230, a phase adjustment factor is added to a FCW to obtain a modified frequency control word, FCW'. In this case, the phase adjustment factor will be equal to the target phase offset. When no phase adjustment is required, the phase adjustment factor would be set equal to zero. As explained above, the FCW is a frequency control word supplied to an NCO to lock the frequency of its output signal to that of a particular external oscillation source. Typically, a timing recovery circuit provides the FCW based on a replicated frequency of an incoming clock signal from another device.

In step 240, FCW' is provided to a NCO. In step 250, the NCO adjusts the phase of its output signal, Clk_out, based on FCW' through the normal operation of a NCO as would be known by an individual skilled in the relevant art(s). In step 255, the system reverts back to the use of FCW after FCW' has been provided to a NCO. In step 260, method 200 ends.

Figure 3A:
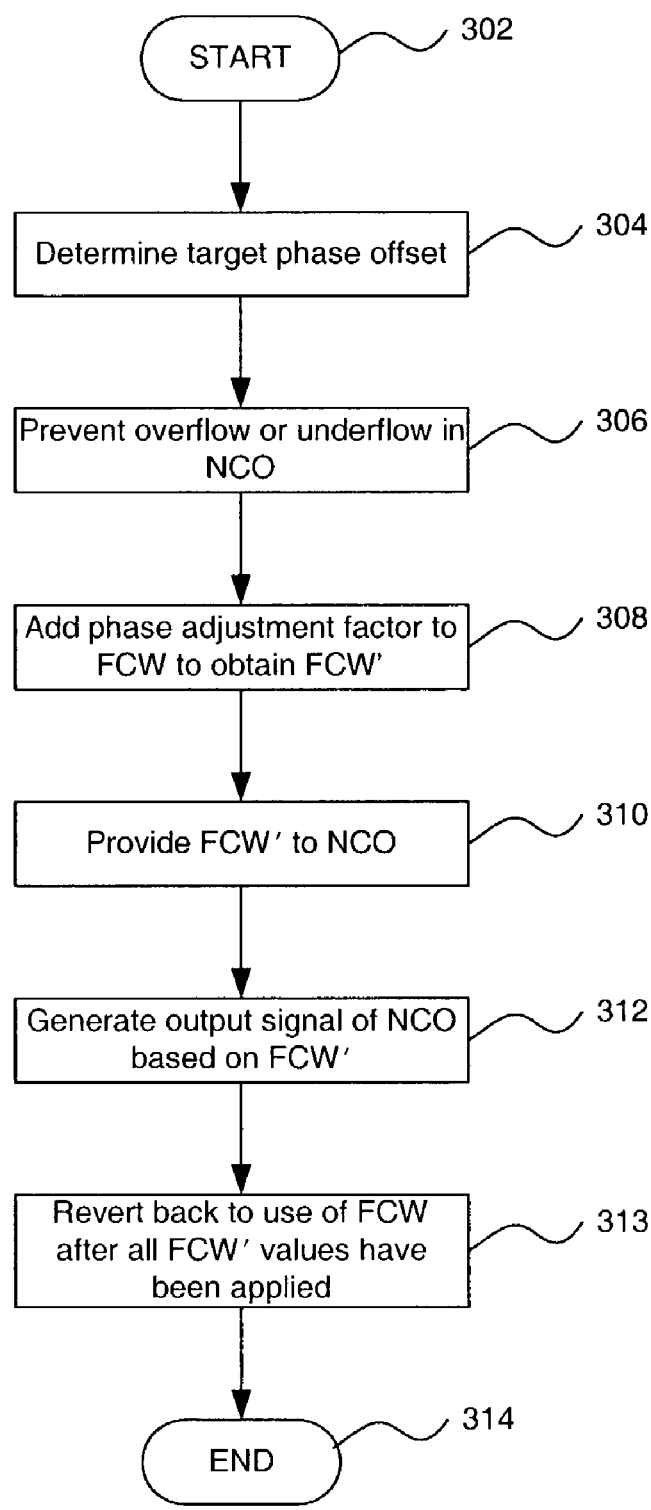
FIG. 3A is a method for adjusting the phase of a frequency locked clock with steps to avoid an overflow or underflow condition, according to an embodiment of the invention.

FIG. 3A illustrates method 300 for adjusting the phase of a frequency locked clock, according to an alternative embodiment of the invention. Method 300 differs from method 200 in that steps are taken to avoid the potential overflow or underflow of a NCO that is used to generate a Clk_out signal. An overflow condition can result when FCW' has a value that exceeds the maximum value for which a NCO produces a predictable and reliable output signal. Similarly, an underflow condition can result when FCW' has a value that is less than a minimum value for which a NCO produces a predictable and reliable output signal. In many scenarios, method 300 may be necessary to ensure predictable and reliable results.

The method begins in step 302. In step 304, a determination is made as to what the target phase offset should be. In the case of digital communications, the target phase offset is the amount of time that the phase of a signal should be shifted. Alternatively, a target fractional phase offset can be determined. In one embodiment, the target phase offset or a target fractional phase offset can be derived from the ranging offset provided to a cable modem from a CMTS.

In step 306, overflow or underflow in a NCO is prevented. Overflow and underflow can be prevented in a number of ways that will be known to individuals skilled in the relevant art(s) based on the teachings herein. One embodiment is illustrated in FIG. 3B and discussed below.

In step 308, a phase adjustment factor that will not lead to underflow or overflow is added to a FCW to obtain FCW'. In this case, the phase adjustment factor may or may not be equal to the target phase offset. When no phase adjustment is required, the phase adjustment factor would be set to zero.

In step 310, FCW' is provided to a NCO. In step 312, the NCO adjusts the phase of its output signal, Clk_out, based on FCW' through the normal operation of a NCO as would be known by an individual skilled in the relevant art(s). In step 313, the system reverts back to the use of FCW after all FCW' values have been provided to a NCO. In step 314, method 300 ends.

Figure 3B:
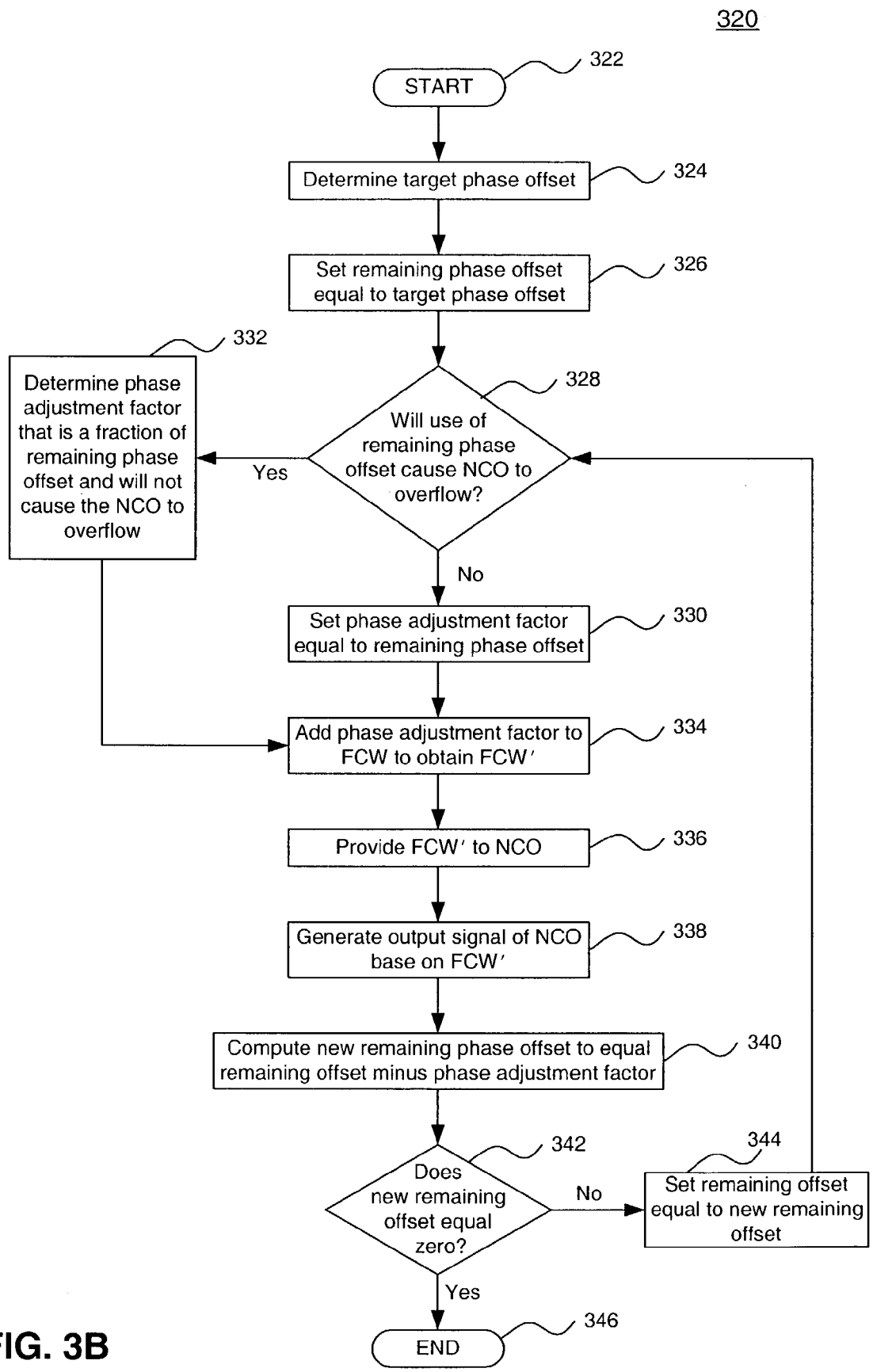
FIG. 3B is a method for adjusting the phase of a frequency locked clock with steps to avoid an overflow or underflow condition, according to an embodiment of the invention.

FIG. 3B illustrates method 320 for adjusting the phase of a frequency locked clock, while preventing an overflow condition in an NCO, according to an embodiment of the invention. Method 320 provides a specific embodiment for implementing method 300. A similar embodiment can be developed to prevent an underflow condition in a NCO, and will be known to individuals skilled in the relevant art(s) based on the teachings herein.

Method 320 begins in step 322. In step 324, a determination is made as to what the target phase offset should be. In step 326, a remaining phase offset is set to the target phase offset. In step 328 a determination is made as to whether the addition of the remaining phase offset to a frequency control word would lead to an overflow condition when applied to the NCO. If a determination is made that the addition of the remaining phase offset to the frequency control word would lead to an overflow condition, the method proceeds to step 332. In step 332, a phase adjustment factor is determined that is equal to a fraction of the remaining phase offset, such that the phase adjustment factor will not cause an overflow condition in the NCO. In one embodiment, the fraction can be selected to be the largest portion of the remaining phase offset that can be used without potentially leading to an overflow condition. The method then proceeds to step 334. Alternatively, if in step 328, a determination is made that the addition of the remaining phase offset to a FCW would not lead to an overflow condition, the method proceeds to step 330. In step 330, the remaining phase offset is used as the phase adjustment factor and the method proceeds to step 334.

In step 334, a phase adjustment factor is added to a FCW to obtain a modified FCW, FCW'. When no phase adjustment is required, the phase adjustment factor would be set equal to zero. In step 336, FCW' is provided to the NCO. In step 338, the NCO adjusts the phase of its output signal, Clk_out, based on FCW' through the normal operation of a NCO as would be known by an individual skilled in the relevant art(s).

In step 340, a new remaining phase offset is computed by subtracting the phase adjustment factor that was added to the FCW from the remaining phase offset. In step 342, a determination is made whether the new remaining phase offset equals zero. If the new remaining phase offset equals zero, the method proceeds to step 346 and ends. If the new remaining phase offset does not equal zero, the method proceeds to step 344. In step 344, the remaining phase offset is set equal to the new remaining phase offset. Method 320 then proceeds back to step 328 to repeat the process of adding the remaining phase offset or a portion of the remaining phase offset to a FCW until the entire target phase offset has been achieved.

Figure 4:
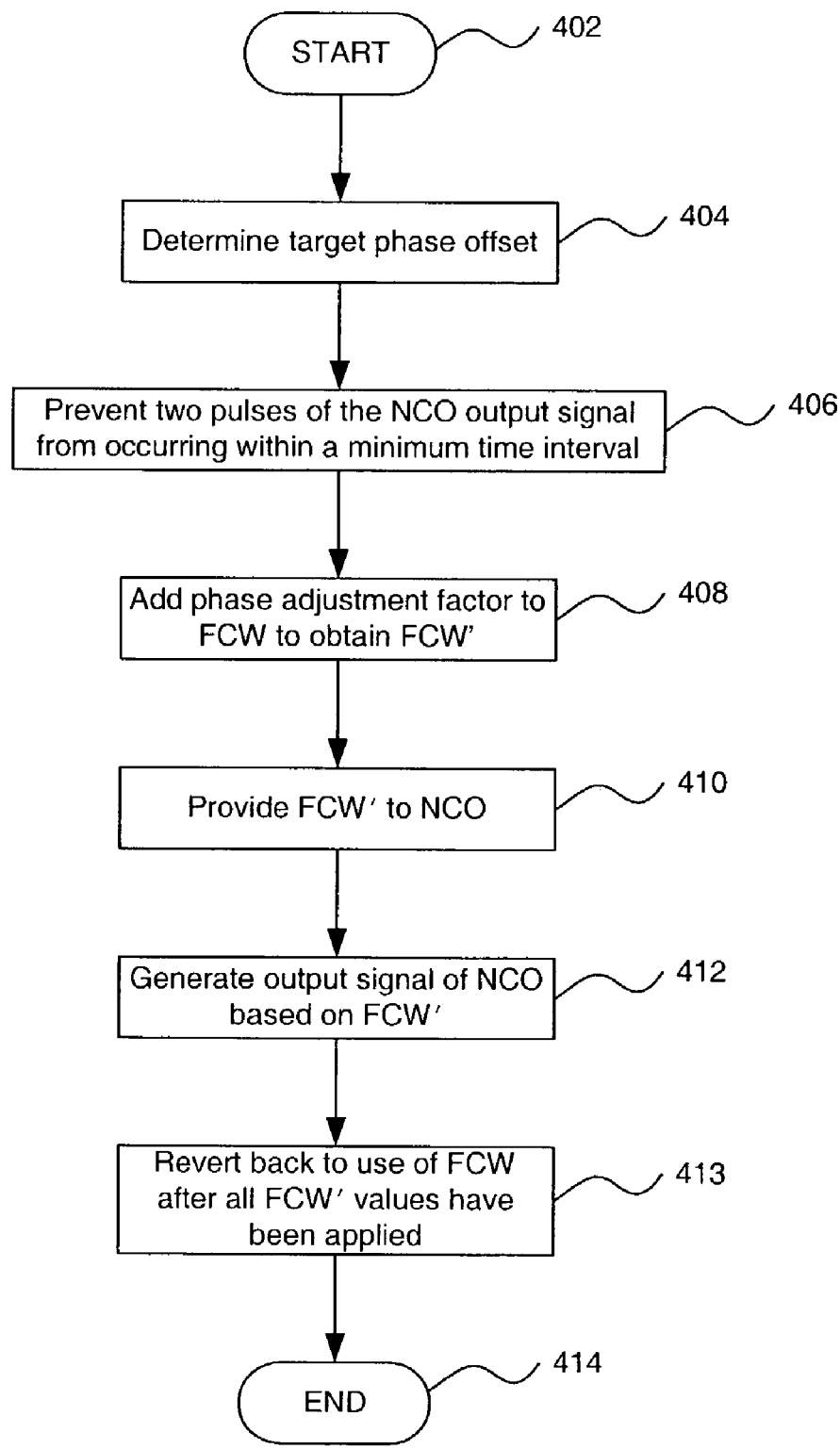
FIG. 4 is a method for adjusting the phase of a frequency locked clock with steps to guarantee a particular duty cycle, according to an embodiment of the invention.

FIG. 4 illustrates method 400 for adjusting the phase of a frequency locked clock, according to an alternative embodiment of the invention. Method 400 differs from method 200 in that method 400 includes steps to ensure that a minimum duty cycle of a Clk_out signal produced by a NCO is maintained. When an adjustment to the phase of Clk_out occurs, two consecutive pulses can occur very quickly. Some devices receiving these pulses may not be capable of receiving pulses so quickly, which could result in these devices not being able to properly interpret the incoming signal. Method 400 can be used to prevent this in devices that are receiving the Clk_out signal by not permitting Clk_out pulses to be generated too closely together as a phase adjustment is made.

Method 400 proceeds in a manner similar to Method 200. Method 400 begins in step 402. In step 404, a determination is made as to what the target phase offset should be. Alternatively, a target fractional phase offset can be determined. In one embodiment, the target phase offset or a target fractional phase offset can be derived from the ranging offset provided to a cable modem from a CMTS.

In step 406, steps are taken to prevent two pulses of the NCO output signal from occurring within a minimum time internal. For example, if within clock signal regeneration system 100, it is required that the cycle period of Clk_out signal 150 always be at least ($\alpha$*Clk_in) cycles long, then this requirement can be satisfied by further restricting the phase adjustment factor, such that:

$$\alpha*(FCW + \text{Phase Adjustment Factor}) \leq \text{the NCO Period} \quad (1)$$

Approaches to satisfying this inequality will be known to individuals skilled in the relevant art(s) based on the teachings herein. Two approaches are described following the description of the remaining steps in Method 400.

Steps 408 through 412 proceed in the same manner as steps 230 through 250 in Method 200. In particular, in step 408, a phase adjustment factor is added to a FCW to obtain a modified frequency control word, FCW'. In this case, the phase adjustment factor will be equal to the target phase offset or some portion of the target phase offset as determined in step 406. When no phase adjustment is required, the phase adjustment factor would be set equal to zero. In step 410, FCW' is provided to the NCO. In step 412, the NCO adjusts the phase of its output signal, Clk_out, based on FCW' through the normal operation of a NCO as would be known by an individual skilled in the relevant art(s). In step 413, the system reverts back to the use of FCW after all FCW' values have been provided to a NCO. In step 414, method 400 ends.

In one embodiment, the inequality of equation (1) may be met by determining a set of phase adjustment factors, $\Delta(n)$, such that $\Sigma\Delta(n)$ equals the target phase offset, and for each $\Delta(n)$, equation (1) above is met. The $\Delta(n)$s would be applied by repeating steps 408 through 412, discussed below, until all $\Delta(n)$s were applied. In another embodiment, this equality may be met using an approach similar to the one described in Method 320. In this case, in step 406 if a determination is made that the condition of equation (1) would not be met, a modified phase adjustment factor can be derived and used that meets the condition of equation (1). Step 408 through Step 412 would then occur. The process would then repeat itself to apply the difference between the phase adjustment factor and the modified phase adjustment factor through a subsequent cycle or multiple cycles of steps 408 through step 412. Other approaches will be known to individuals skilled in the relevant art(s) based on the teachings herein.

Exemplary embodiments of various methods to adjust the phase of a frequency locked clock are described above. The present invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

Figure 5:
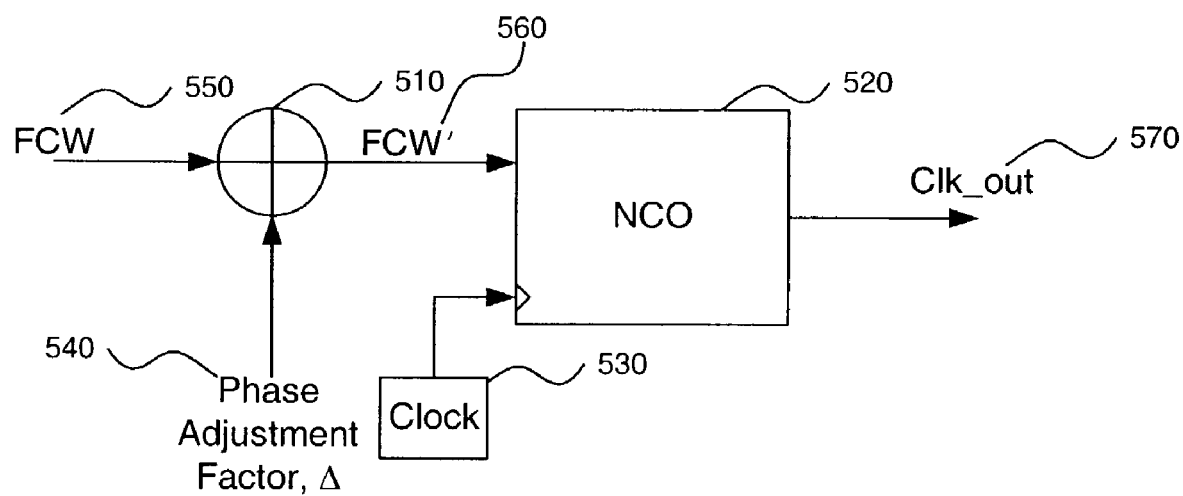
FIG. 5 is a diagram of a clock signal regeneration system with the capability to adjust the phase of a frequency-locked clock, according to an embodiment of the invention.

FIG. 5 illustrates clock signal regeneration system 500. Clock signal regeneration system 500 comprises adder 510, NCO 520 and clock 530. The solid lines between these components represent electrical connections. Clock signal regeneration system 500 may be used to regenerate clock signal pulses with the capability to adjust the phase of a frequency-locked clock signal. Clock signal regeneration system 500 may be implemented with integrated circuits and components that are readily known to individuals skilled in the relevant art(s).

Figure 1:
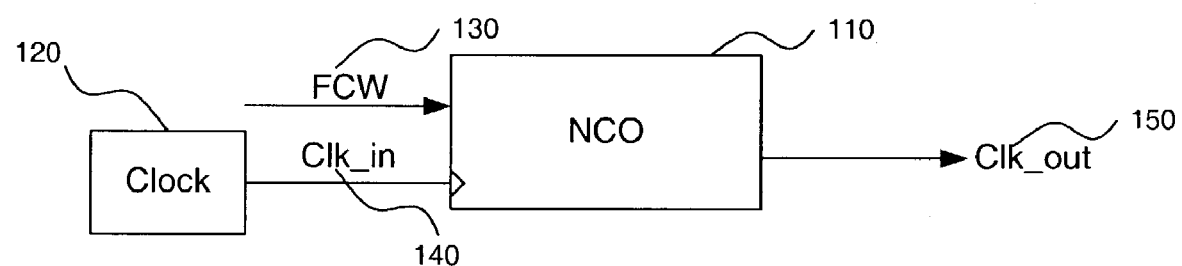
FIG. 1 is a diagram of a clock signal regeneration system.

NCO 520 and clock 530 comprise a typical clock signal regeneration system, such as the one illustrated in FIG. 1 and discussed above. Adder 510 is a digital component that adds two inputs together. In this case, the adder receives as an input, FCW 550, and as another input, phase adjustment factor 540. Adder 510 adds phase adjustment factor 540 to FCW 550 to output FCW' 560. FCW' 560 and the clock signal from clock 530 serve as the inputs to NCO 520. NCO 520 outputs Clk_out signal 570, which represents a regenerated clock pulse with a phase shift based on phase adjustment factor 540.

In one embodiment of the invention, clock signal regeneration system 500 can be used to regenerate a clock signal used to ensure synchronous operation of a cable modem and a CMTS. In this case, a CMTS may notify the cable modem to adjust the phase of the clock signal by transmitting a ranging offset. Phase adjustment factor 540 could be derived from this ranging offset. Likewise, FCW 550 can be provided to clock signal regeneration system 500 from a timing recovery circuit within a cable modem. FCW 550 would contain information that locks the frequency of clk_out 570 to the frequency of the clock signal being transmitted from the CMTS to a cable modem. Using clock regeneration system 500 phase adjustments can be made to a frequency locked clock signal being regenerated by the cable modem to ensure precise time synchronization between a cable modem and a CMTS. Likewise, clock regeneration system 500 can be used within a wide range of applications requiring precise time synchronization, such as cellular communication systems or satellite communications systems.

Figure 6:
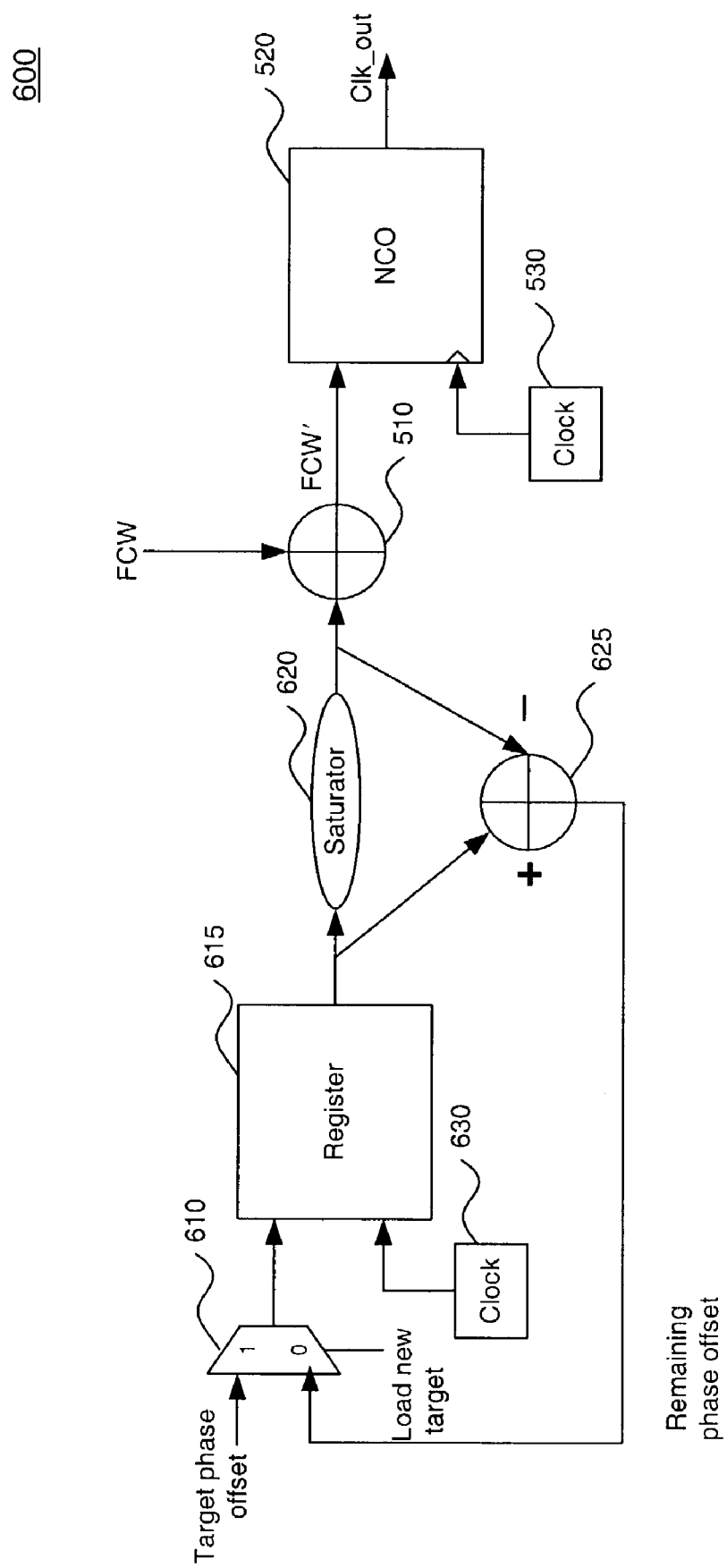
FIG. 6 is a diagram of a clock signal regeneration system with the capability to adjust the phase of a frequency-locked clock using a target phase offset and to prevent potential underflow or overflow, according to an embodiment of the invention.

FIG. 6 illustrates clock signal regeneration system 600. Clock signal regeneration system 600 is similar to clock signal regeneration system 500 except that it includes components to prevent the potential underflow or overflow of a NCO used within the system. As in the case of clock signal regeneration system 500, clock signal regeneration system 600 comprises adder 510, NCO 520 and clock 530. In addition, clock signal regeneration system 600 comprises multiplexer 610, register 615, clock 630, saturator 620 and adder 625. The solid lines between these components represent electrical connections. Clock signal regeneration system 600 may be implemented with integrated circuits and components that are readily known to individuals skilled in the relevant art(s).

Multiplexer 610 receives as inputs a target phase offset and a remaining phase offset. The target phase offset will be provided from another device or circuit, and provides the phase offset desired for the frequency-locked clock signal. In an alternate embodiment, a converter may be coupled to the target phase offset input of multiplexer 610 to provide the target phase offset. The converter device can receive as its input instructions to realize a target phase offset in any format (e.g., seconds, a fraction of the NCO clock period, or a function of the FCW) and convert the instructions to the appropriate format. As discussed further below, the remaining phase offset is the output of adder 625, and represents the portion of the target phase offset that has not been applied to the frequency-locked clock signal. Multiplexer 610 contains a load new target indicator for determining which input to output. The load new target indicator will be set by external sources, such as an administrative module. When a new target offset is provided, the load new target indicator will be set such that the output of multiplexer 610 is the new target offset. Otherwise, the indicator will be set such that the remaining phase offset will be the output of multiplexer 610.

The output of multiplexer 610 serves as one of the inputs to register 615. The other input to register 615 is a clock signal generated by clock 630. The purpose of register 615 is to hold a remaining phase offset, and to provide that phase offset to saturator 620 at the appropriate time based on the clock signal from clock 630. Saturator 620 receives the output of register 615 and provides as an output a fraction of the remaining phase offset. Saturator 620 can be adjusted to ensure that its output is within certain minimum and maximum values to ensure that NCO 520 does not overflow or underflow.

Adder 625 is coupled to the output of register 615 and the output of saturator 620. The output of register 615 can be considered the current remaining phase offset and the output of saturator 620 can be considered as a phase adjustment factor. The difference between the current remaining phase offset and the phase adjustment factor represents a new remaining phase offset. Adder 625 functions as a subtraction device, and thus, the output of adder 625 represents a new remaining phase offset. The new remaining phase offset is provided back to multiplexer 610 to be stored in register 615 as the remaining phase offset until such time as it should be provided to saturator 620.

As was discussed with respect to clock signal regeneration system 500, NCO 520 and clock 530 comprise a typical clock signal regeneration system. Adder 510 is a digital component that adds two inputs together. In this case, adder 510 receives as one input, FCW, and as another input, a phase adjustment factor that is the output of saturator 620. Adder 510 adds the output of saturator 620, which represents a phase adjustment factor, to FCW 550 to output a modified frequency control word, FCW'. FCW' and the clock signal from clock 530 are the inputs to NCO 520. NCO 520 outputs Clk_out signal 570, which represents a regenerated clock pulse with a phase shift based on the phase adjustment factor.

Figure 7:
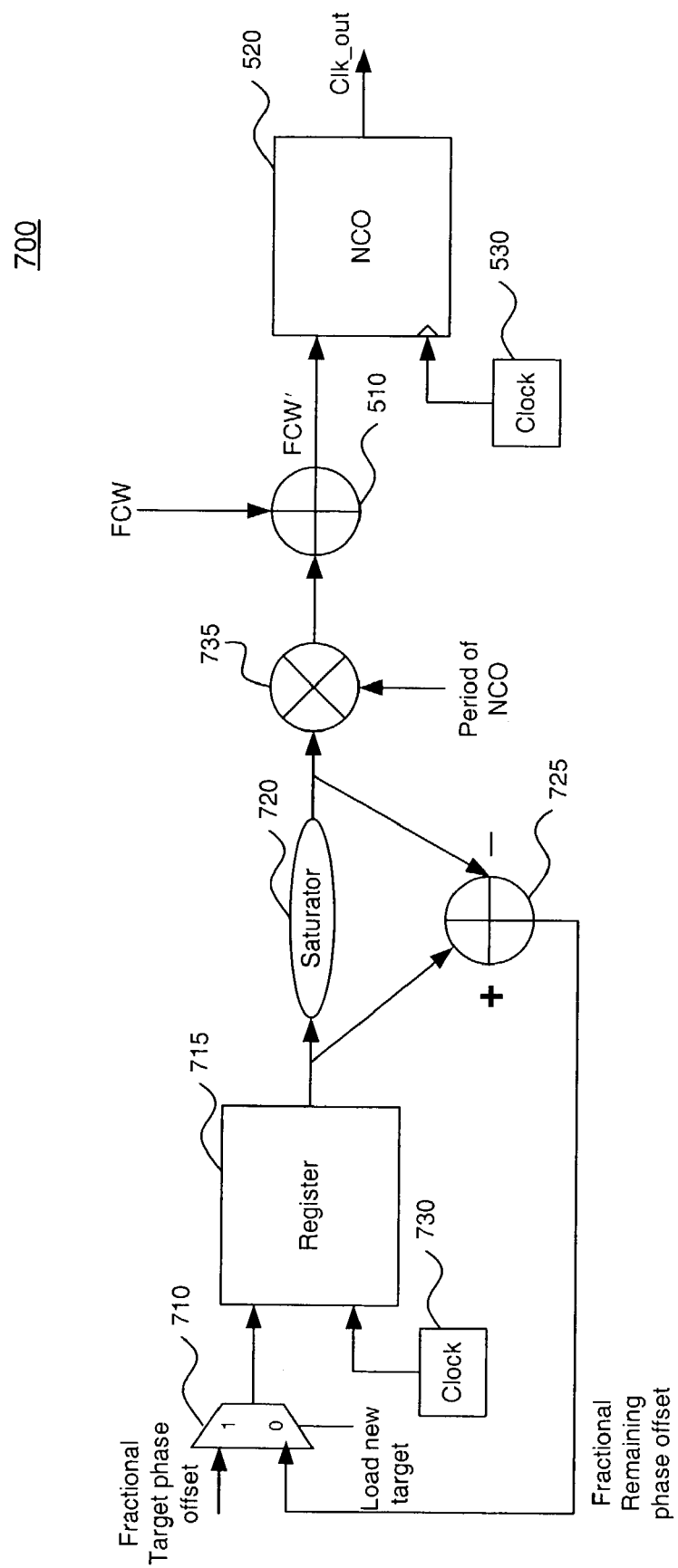
FIG. 7 is a diagram of a clock signal regeneration system with the capability to adjust the phase of a frequency-locked clock using a target fractional phase offset and to prevent potential underflow or overflow, according to an embodiment of the invention.

FIG. 7 illustrates clock signal regeneration system 700. Clock signal regeneration system 700 is similar to clock regeneration system 600 except that instead of receiving a target phase offset, which is provided in units of seconds, it receives a target fractional phase offset that is provided as a fraction of the period of NCO 520. For example, if the period of NCO 520 is one microsecond and a 500 nanosecond target phase offset is desired, the target fractional phase offset would be one half. As in the case of clock signal regeneration system 600, clock signal regeneration system 700 includes components to prevent the potential underflow or overflow of a NCO used within the system. As in the case of both clock signal regeneration system 500 and 600, clock signal regeneration system 700 comprises adder 510, NCO 520 and clock 530. In addition, clock signal regeneration system 700 comprises multiplexer 710, register 715, clock 730, saturator 720, adder 725 and multiplier 735. The solid lines between these components represent electrical connections. Clock signal regeneration system 700 may be implemented with integrated circuits and components that are readily known to individuals skilled in the relevant art(s).

Multiplexer 710 receives as inputs a target fractional phase offset and a remaining fractional phase offset. The target fractional phase offset will be provided from another device or circuit, and provides the fractional phase offset desired for the frequency-locked clock signal. As discussed further below, the remaining fractional phase offset is the output of adder 725, and represents the portion of the target fractional phase offset that has not been applied. Multiplexer 710 contains a load new target indicator for determining which input to output. The load new target indicator will be set by external sources, such as an administrative module. When a new target fractional phase offset is provided, the load new target indicator will be set such that the output of multiplexer 710 is the new target fractional phase offset. Otherwise, the indicator will be set such that the remaining fractional phase offset will be the output of multiplexer 710.

The output of multiplexer 710 serves as one of the inputs to register 715. The other input to register 715 is a clock signal generated by clock 730. The purpose of register 715 is to hold a remaining fractional phase offset, and to provide that fractional phase offset to saturator 720 at the appropriate time based on the clock signal from clock 730. Saturator 720 receives the output of register 715 and provides as an output a fraction of the remaining fractional phase offset. Saturator 715 can be adjusted so that its output is within certain minimum and maximum values to ensure that NCO 520 does not overflow or underflow.

Adder 725 is coupled to the output of register 715 and the output of saturator 720. The output of register 715 can be considered the current remaining fractional phase offset and the output of saturator 720 can be considered as a fractional phase adjustment factor. The difference between the current remaining fractional phase offset and the fractional phase adjustment factor represents a new remaining fractional phase offset. Adder 725 functions as a subtraction device, and thus, the output of adder 725 represents a new remaining fractional phase offset. The new remaining fractional phase offset is provided back to multiplexer 710 to be stored in register 715 as the remaining fractional phase offset until such time as it should be provided to saturator 720.

The output of saturator 720, representing a fractional phase adjustment factor, is provided as one input to multiplier 735. The other input to multiplier 735 is the period of NCO 520. Multiplier 735 outputs the product of these two inputs to provide a phase adjustment factor. In an alternate embodiment, the output of saturator 720 may be in some other format, for example, if the fractional target phase offset had been provided as a function of FCW, the output may be a function of FCW. In this case, multiplier 735 would be replaced by a converter that converts the output of saturator 720 to provide a phase adjustment factor.

As was discussed with respect to clock signal regeneration system 500 and 600, NCO 520 and clock 530 comprise a typical clock signal regeneration system. Adder 510 is a digital component that adds two inputs together. In this case, adder 510 receives as one input, FCW, and as another input, a phase adjustment factor, that is the output of multiplier 735. Adder 510 adds the output of saturator 735, which represents a phase adjustment factor, to FCW 550 to output a modified frequency control word, FCW'. FCW' and the clock signal from clock 530 are the inputs to NCO 520. NCO 520 outputs Clk_out signal 570, which represents a regenerated clock pulse with a phase shift based on a phase adjustment factor.

Exemplary embodiments of a clock signal regeneration system that can be used to adjust the phase of a frequency locked clock are described above. The present invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

What is claimed is:

1. A method for adjusting the phase of a frequency locked clock signal, comprising:
   (a) receiving a target phase offset;
   (b) setting a remaining phase offset equal to the target phase offset;
   (c) determining whether providing the sum of the remaining phase offset and a frequency control word to a numerically controlled oscillator would cause the numerically controlled oscillator to overflow,
   (d) if the numerically controlled oscillator would overflow using the remaining phase offset, computing a phase adjustment factor that is a fraction of the remaining phase offset that will prevent the numerically controlled oscillator from overflowing and computing a new remaining phase offset that equals the present remaining phase offset less the phase adjustment factor, then proceeding to step (f);
   (e) if the numerically controlled oscillator would not overflow using the remaining phase offset, setting a phase adjustment factor to be equal to the remaining phase offset;
   (f) adding the phase adjustment factor to a frequency control word to create a modified frequency control word;
   (g) providing the modified frequency control word to a numerically controlled oscillator;
   (h) generating an output signal of the numerically controlled oscillator based on the modified frequency control word; and
   (i) if the phase adjustment factor was set to a value other than the remaining phase offset in step (e), repeating steps (c) through steps (i).

2. A method for adjusting the phase of a frequency locked clock signal, comprising:
   (a) receiving a target phase offset;
   (b) setting a remaining phase offset equal to the target phase offset;
   (c) determining whether providing the sum of the remaining phase offset and a frequency control word to a numerically controlled oscillator would cause the numerically controlled oscillator to underflow;
   (d) if the numerically controlled oscillator would underflow using the remaining phase offset, computing a phase adjustment factor that is a fraction of the remaining phase offset that will prevent the numerically controlled oscillator from underflowing and computing a new remaining phase offset that equals the present remaining phase offset less the phase adjustment factor, then proceeding to step (f);
(e) if the numerically controlled oscillator would not underflow using the remaining phase offset, setting a phase adjustment factor to be equal to the remaining phase offset;
(f) adding the phase adjustment factor to a frequency control word to create a modified frequency control word;
(g) providing the modified frequency control word to a numerically controlled oscillator;
(h) generating an output signal of the numerically controlled oscillator based on the modified frequency control word; and
(i) if the phase adjustment factor was set to a value other than the remaining phase offset in step (e), repeating steps (c) through steps (i).

3. A clock signal regeneration system to adjust the phase of a frequency-locked clock signal, comprising:
(a) a multiplexer for receiving a target phase offset and a remaining phase offset, and for outputting either said target phase offset or said remaining phase offset based on a load new target indicator;
(b) a second clock for generating a second clock output signal;
(c) at least one register for receiving an output from said multiplexer and the second clock output signal, and for storing said remaining phase offset;
(d) a saturator for receiving the output of said at least one register and for providing a phase adjustment factor that is a fraction of the remaining phase offset to a first adder;
(e) a second adder for adding the output of said at least one register and said saturator and for providing a resulting remaining phase offset to said multiplexer;
(f) said first adder for adding a frequency control word and the phase adjustment factor;
(g) a first clock for providing a clock pulse; and
(h) a numerically controlled oscillator for receiving an output from said first adder and an output from said first clock for generating an output clock signal.

4. The clock signal regeneration system of claim 3, further comprising a converter for converting a message containing instructions for the phase adjustment to the target phase offset in a proper format that provides the target phase offset to said multiplexer.

5. A clock signal regeneration system to adjust the phase of a frequency-locked clock signal, comprising:
(a) a multiplexer for receiving as inputs a target fractional phase offset and a remaining fractional phase offset, and for outputting either said target fractional phase offset or said remaining fractional phase offset based on a load new target indicator;
(b) a second clock for generating a second clock output signal;
(c) at least one register for receiving an output from said multiplexer and the second clock output signal, and for storing said remaining fractional offset;
(d) a saturator for receiving the output of said at least one register and for providing a fractional phase adjustment factor that is a fraction of said remaining fractional phase offset
(e) a second adder for adding the output of said at least one register and said saturator and for providing a remaining fractional phase offset to said multiplexer;
(f) a converter for manipulating the output of said saturator and for providing a resulting phase adjustment factor to a first adder;
(g) said first adder for adding a frequency control word and the phase adjustment factor;
(h) a first clock for providing a clock pulse; and
(i) a numerically controlled oscillator for receiving an output from said first adder and an output from said first clock for generating an output clock signal.

6. The clock signal regeneration system of claim 5 wherein said converter is a multiplier that multiplies the output of said saturator and a period of the numerically controlled oscillator and for providing a resulting phase adjustment factor to said first adder.

* * * * *